(12) United States Patent
Asgaran (10) Patent No.: US 11,533,204 B2
(45) Date of Patent: Dec. 20, 2022

(54) HIGH SPEED DIGITAL DATA TRANSMISSION

(71) Applicant: ATI Technologies ULC, Markham (CA)

(72) Inventor: Saman Asgaran, Markham (CA)

(73) Assignee: ATI Technologies ULC, Markham (CA)

( * ) Notice: Subject to any disclaimer, the term of this patent is extended or adjusted under 35 U.S.C. 154(b) by 101 days.

(21) Appl. No.: 17/121,221

(22) Filed: Dec. 14, 2020

(65) Prior Publication Data

US 2022/0191070 A1 Jun. 16, 2022

(51) Int. Cl.
| | |
|---|---|
| *H04L 25/03* | (2006.01) |
| *H04B 1/16* | (2006.01) |
| *G06F 13/16* | (2006.01) |
| *H03F 3/19* | (2006.01) |

(52) U.S. Cl.
CPC .... *H04L 25/03057* (2013.01); *G06F 13/1668* (2013.01); *H03F 3/19* (2013.01); *H04B 1/16* (2013.01); *H04L 25/03267* (2013.01)

(58) Field of Classification Search
CPC . H03F 3/189; H03F 3/19; H03F 3/193; H03F 3/1935; H04B 1/10; H04B 1/1081; H04B 1/123; H04B 1/16; H04B 1/18; H04B 1/38; H04B 1/40; H04L 25/03006; H04L 25/03019; H04L 25/03057; H04L 25/03254; H04L 25/03267; H04L 25/03878; H04L 25/03885; G06F 13/14; G06F 13/1668
USPC ....... 375/219, 220, 232, 233, 257, 346, 348; 455/63.1, 296; 708/322, 323
See application file for complete search history.

(56) References Cited

U.S. PATENT DOCUMENTS

| | | | |
|---|---|---|---|
| 8,983,417 B2 | 3/2015 | Koroglu et al. | |
| 9,397,623 B1 * | 7/2016 | Lacroix | H03F 3/45197 |
| 9,647,618 B1 * | 5/2017 | Yuan | H03G 3/004 |
| 10,243,531 B1 * | 3/2019 | Thiagarajan | H03G 3/30 |
| 2013/0114665 A1 * | 5/2013 | Aziz | H03F 3/45183 |
| | | | 330/69 |

(Continued)

OTHER PUBLICATIONS

Paul R. Gray, Paul J. Hurst, Stephen H Lewis, Robert G. Meyer; "Analysis and Design of Analog Integrated Circuits"; Fourth Edition, book; Published 2001; John Wiley & Sons, Inc., 605 Third Avenue, New York, NY, 10158-0012, United States; excerpt including pp. 213-215, 609, and 610 (8 pages).

*Primary Examiner* — Young T. Tse
(74) *Attorney, Agent, or Firm* — Polansky & Associates, P.L.L.C.; Paul J. Polansky; Nathan H. Calvert (57) ABSTRACT

A receiver circuit includes an analog front end and a non-linear equalizer. The analog front end including a super source follower (SSF) amplifier having a first input terminal adapted to couple to a transmission line to receive an input signal referenced to a first voltage level, a second input adapted to receive a reference voltage, and first and second output terminals adapted to provide an amplified signal referenced to a second voltage level. The non-linear equalizer coupled to receive an output signal of the analog front end and compensate for inter-symbol interference at a data rate of at least 14 Gbps. The SSF amplifier includes transistors having relative sizes selected to provide a frequency response of the SSF amplifier with a peak at a frequency approximately ⅔ of the data rate.

20 Claims, 6 Drawing Sheets

(56) References Cited

U.S. PATENT DOCUMENTS

2019/0312756 A1* 10/2019 Musah .................. H04L 7/0334
2020/0007379 A1* 1/2020 Patil ........................ H04L 27/06

* cited by examiner

HIGH SPEED DIGITAL DATA TRANSMISSION

BACKGROUND

High-speed serial data links are widely used to send and receive data over a "wired" channel or transmission line, which could be a piece of metal routing on a printed circuit board (PCB) such as the copper routing generally employed with a flame-retardant 4 (FR4) dielectric trace. Due to frequency-dependent losses such as skin effect and dielectric loss, transmitted data may become corrupted by inter-symbol interference (ISI) once it travels through the channel. For a certain data-rate (DR), the channel loss at Nyquist frequency (DR/2) determines how much ISI is introduced to the transmitted data on the receive side.

To minimize ISI on the receiver end, the frequency response of the channel should be equalized. This equalization is often done by a continuous-time linear equalizer (CTLE), a decision-feedback equalizer (DFE), or a combination of both. A CTLE tries to equalize losses by replicating an inverse of channel's alternating current (AC) frequency response, while a DFE removes post-cursor ISI using a sampler and delay components.

One important application of high speed data links is a communication interface between dynamic random-access memory (DRAM) and a processor such as a graphics processing unit (GPU). These interfaces often use graphics double data rate (GDDR) memory with several hundred data links employed together in parallel to increase data throughput. Therefore, it is crucial to keep power consumption of the serial links as low as possible.

In a DRAM-GPU interface, beside the stringent low-power requirements, the CTLE must convert a single-ended incoming data stream from an input/output supply domain to a core supply domain while performing linear equalization. In some current solutions, this is done using a folded-cascode type amplifier followed by three amplifiers each driving two data samplers inside the DFE. However, a folded-cascode amplifier introduces an extra pole, thereby limiting the bandwidth of CTLE if it directly drives the DFE. This characteristic necessitates the use of second stage amplifiers that require extra power consumption. The use of the second stage amplifiers also results in poor low-frequency linearity which in turn impacts the effectiveness of the DFE.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A receiver circuit includes an analog front end and a non-linear equalizer. The analog front end includes a super source follower (SSF) amplifier having a first input terminal adapted to couple to a transmission line to receive an input signal referenced to a first voltage level, a second input adapted to receive a reference voltage, and first and second output terminals adapted to provide an amplified signal referenced to a second voltage level. The non-linear equalizer is connected to receive an output signal of the analog front end and compensate for inter-symbol interference at a data rate of at least 14 giga-bits per second (Gbps). The SSF amplifier includes transistors having relative sizes selected to provide a frequency response of the SSF amplifier with a peak at a frequency approximately ⅔ of the data rate.

A data processing includes a DRAM memory and a data processor coupled to the DRAM memory with one or more transmission lines. The data processor includes respective receivers coupled to the transmission lines to receive data signals therefrom. The receivers each include an analog front end and a non-linear equalizer. The analog front end includes a SSF amplifier having a first input terminal coupled to a respective one of the transmission lines to receive an input signal referenced to a first voltage level, a second input adapted to receive a reference voltage, and first and second output terminals adapted to provide an amplified signal referenced to a second voltage level. The non-linear equalizer is connected to receive an output signal of the analog front end and compensate for inter-symbol interference at a data rate of at least 14 Gbps. The SSF amplifier includes transistors having relative sizes selected to provide a frequency response of the SSF amplifier with a peak at a frequency approximately ⅔ of the data rate.

A method includes, at a first circuit, receiving a signal over a transmission line from a second circuit, the signal referenced to a first voltage level and having a data rate of at least 14 Gbps. The method inputs the signal to an analog front end including a SSF amplifier having a frequency response with a peak at a frequency approximately ⅔ of the data rate, outputting an amplified version of the signal from the analog front end referenced to a second voltage level different from the first voltage level, and inputs the amplified version of the signal to a non-linear equalizer compensate for inter-symbol interference.

Figure 1:
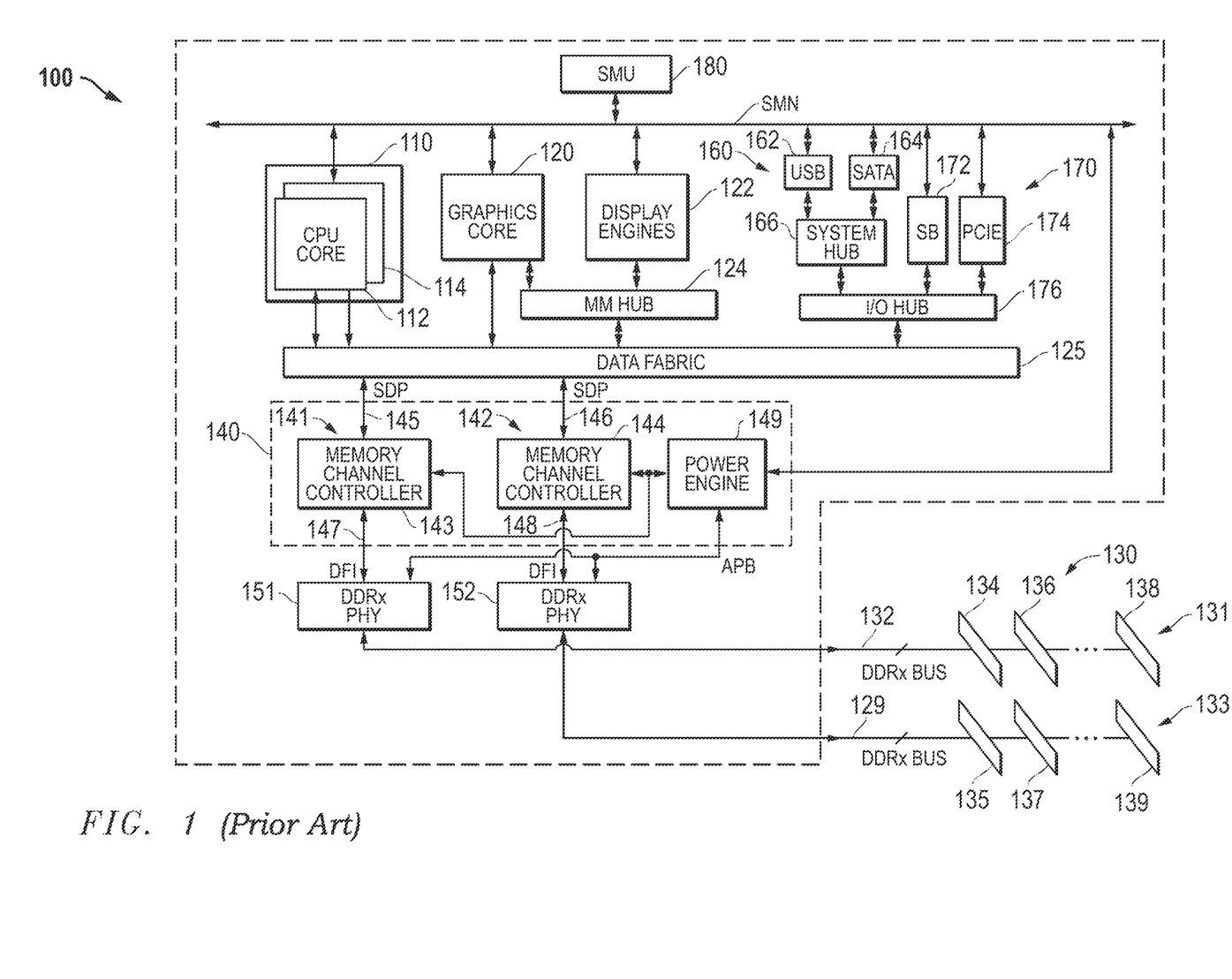
FIG. 1 illustrates in block diagram form a data processing system according to some embodiments.

FIG. 1 illustrates in block diagram form an accelerated processing unit (APU) 100 and memory system 130 known in the prior art. APU 100 is an integrated circuit suitable for use as a processor in a host data processing system, and includes generally a central processing unit (CPU) core complex 110, a graphics core 120, a set of display engines 122, a memory management hub 140, a data fabric 125, a set of peripheral controllers 160, a set of peripheral bus controllers 170, and a system management unit (SMU) 180. As will be appreciated by a person of ordinary skill APU 100 may not have all of these elements present in every embodiment, and, further, may have additional elements included therein. Furthermore, in some versions APU 100 is embodied in multiple integrated circuits in a system. While an APU is shown in this version, other embodiments that employ the receiver techniques herein in other integrated circuits, such as graphics processing units (GPUs) Has been amended to "and DRAMs. For example, a receiver can be in a DRAM and a driver can be in a data processor.

CPU core complex 110 includes a CPU core 112 and a CPU core 114. In this example, CPU core complex 110 includes two CPU cores, but in other embodiments CPU core complex 110 can include an arbitrary number of CPU cores. Each of CPU cores 112 and 114 is bidirectionally connected to a system management network (SMN), which forms a control fabric, and to data fabric 125, and is capable of providing memory access requests to data fabric 125. Each of CPU cores 112 and 114 may be unitary cores, or may further be a core complex with two or more unitary cores sharing certain resources such as caches.

Graphics core 120 is a high performance GPU capable of performing graphics operations such as vertex processing, fragment processing, shading, texture blending, and the like in a highly integrated and parallel fashion. Graphics core 120 is bidirectionally connected to the SMN and to data fabric 125, and is capable of providing memory access requests to data fabric 125. In this regard, APU 100 may either support a unified memory architecture in which CPU core complex 110 and graphics core 120 share the same memory space, or a memory architecture in which CPU core complex 110 and graphics core 120 share a portion of the memory space, while graphics core 120 also uses a private graphics memory not accessible by CPU core complex 110.

Display engines 122 render and rasterize objects generated by graphics core 120 for display on a monitor. Graphics core 120 and display engines 122 are bidirectionally connected to a common memory management hub 140 for uniform translation into appropriate addresses in memory system 130, and memory management hub 140 is bidirectionally connected to data fabric 125 for generating such memory accesses and receiving read data returned from the memory system.

Data fabric 125 includes a crossbar switch for routing memory access requests and memory responses between any memory accessing agent and memory management hub 140. It also includes a system memory map, defined by basic input/output system (BIOS), for determining destinations of memory accesses based on the system configuration, as well as buffers for each virtual connection.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral bus controllers 170 include a system controller or "Southbridge" (SB) 172 and a Peripheral Component Interconnect Express (PCIe) controller 174, each of which is bidirectionally connected to an input/output (I/O) hub 176 and to the SMN bus. I/O hub 176 is also bidirectionally connected to system hub 166 and to data fabric 125. Thus for example a CPU core can program registers in USB controller 162, SATA interface controller 164, SB 172, or PCIe controller 174 through accesses that data fabric 125 routes through I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through the SATA interface.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 includes one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states.

Memory management hub 140 and its associated physical interfaces (PHYs) 151 and 152 are integrated with APU 100 in this embodiment. Memory management hub 140 includes memory channels 141 and 142 and a power engine 149. Memory channel 141 includes a host interface 145, a memory channel controller 143, and a physical interface 147. Host interface 145 bidirectionally connects memory channel controller 143 to data fabric 125 over a serial presence detect link (SDP). Physical interface 147 bidirectionally connects memory channel controller 143 to PHY 151, and conforms to the DDR PHY Interface (DFI) Specification. Memory channel 142 includes a host interface 146, a memory channel controller 144, and a physical interface 148. Host interface 146 bidirectionally connects memory channel controller 144 to data fabric 125 over another SDP. Physical interface 148 bidirectionally connects memory channel controller 144 to PHY 152, and conforms to the DFI Specification. Power engine 149 is bidirectionally connected to SMU 180 over the SMN bus, to PHYs 151 and 152 over the APB, and is also bidirectionally connected to memory channel controllers 143 and 144. PHY 151 has a bidirectional connection to memory channel 131. PHY 152 has a bidirectional connection memory channel 133.

Memory management hub 140 is an instantiation of a memory controller having two memory channel controllers and uses a shared power engine 149 to control operation of both memory channel controller 143 and memory channel controller 144 in a manner that will be described further below. Each of memory channels 141 and 142 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Memory system 130 includes a memory channel 131 and a memory channel 133. Memory channel 131 includes a set of dual inline memory modules (DIMMs) connected to a double data rate (DDRx) bus 132, including representative DIMMs 134, 136, and 138 that in this example correspond to separate ranks. Likewise, memory channel 133 includes a set of DIMMs connected to a DDRx bus 129, including representative DIMMs 135, 137, and 139.

APU 100 operates as the central processing unit (CPU) of a host data processing system and provides various buses and interfaces useful in modern computer systems. These interfaces include two DDRx memory channels, a PCIe root complex for connection to a PCIe link, a USB controller for connection to a USB network, and an interface to a SATA mass storage device.

APU 100 also implements various system monitoring and power saving functions. In particular one system monitoring function is thermal monitoring. For example, if APU 100 becomes hot, then SMU 180 can reduce the frequency and voltage of CPU cores 112 and 114 and/or graphics core 120. If APU 100 becomes too hot, then it can be shut down entirely. Thermal events can also be received from external sensors by SMU 180 via the SMN bus, and SMU 180 can reduce the clock frequency and/or power supply voltage in response.

Figure 2:
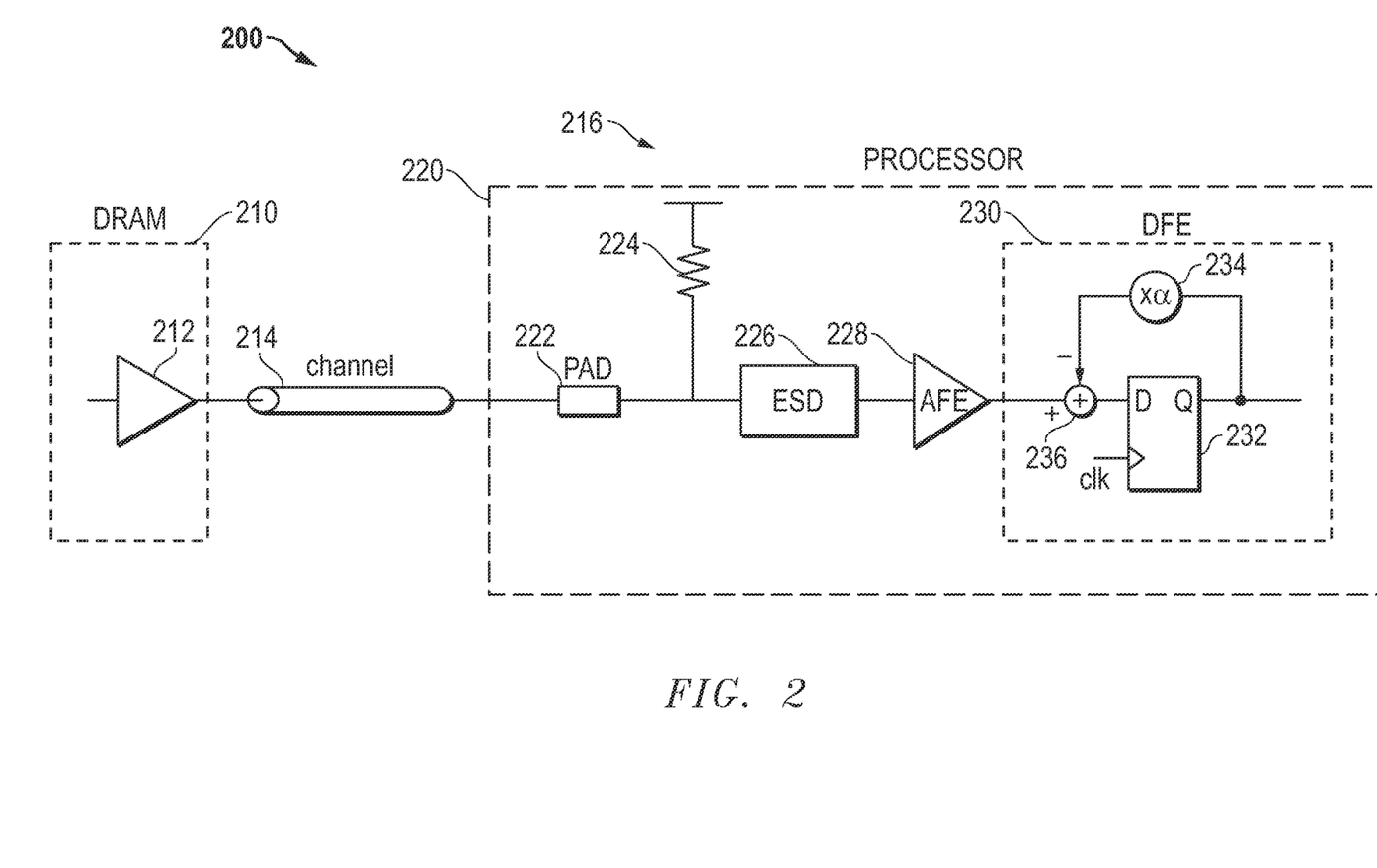
FIG. 2 shows in mixed block diagram and circuit form a communication link coupling a memory to a data processor.

FIG. 2 shows in mixed block diagram and circuit form a communication link 200 coupling a dynamic random-access memory (DRAM) 210 to a data processor 216. Communication link 200 generally includes a driver 212 at DRAM 210 driving a signal onto a channel 214 for transmission to a receiver 220 at data processor 216, wherein data processor 216 can be a CPU, a GPU, an APU, or another type of digital circuit that transmits data at very high speeds.

Driver 212 is built with any suitable design and in some versions includes pre-distortion such as a feed-forward equalizer in order to shape the transmitted signal to compensate for the transfer function of channel 214. In this embodiment, the transmitted signal is a single-ended voltage signal referenced to an input/output (I/O) voltage supply level. Channel 214 is typically constructed with a transmission line including metal routing on a printed circuit board (PCB) or other substrate to which is mounted DRAM 210 and data processor 216. Transmission lines in preferred embodiments use an FR4 dielectric trace.

Receiver 220 includes an input pad 222 electrically connecting channel 214 and a low-resistance package conductor to the depicted on-chip signal input path. A termination resistor 224, typically a tunable on-die termination, connects the input path to a voltage supply rail. An electro-static discharge (ESD) circuit 226 is connected in series, and functions to protect an analog front end (AFE) 228 from static impulses. AFE 228 generally receives the incoming signal and operates to convert the single-ended incoming data stream from the I/O supply domain to a core supply domain while performing linear equalization to equalize losses from the channel 214 by inverting some of the AC transfer function of channel 214. AFE 228 is further described with respect to FIGS. 3-5.

The output of AFE 228 is connected to a non-linear equalizer, which in this embodiment is a decision-feedback equalization (DFE) circuit 230 ("DFE 230"), which operates to remove post-cursor ISI. Many suitable designs may be used in place of DFE 230, including multi-tap designs. In this embodiment, DFE 230 is a 1-tap half-rate speculative DFE including a latch 232, a weighted feedback tap 234, and a summer/slicer 236. In operation, summer/slicer 236 receives the output of AFE 228 and the output of weighted feedback tap 234, provided with a negative value as shown, and sums them. The summed signal is fed to the data input of latch 232. Latch 232 creates a decision output under control of a clock signal "clk" to provide a digital value for the received signal. This output is also fed back to weighted feedback tap 234 to mitigate post-cursor interference.

Figure 3:
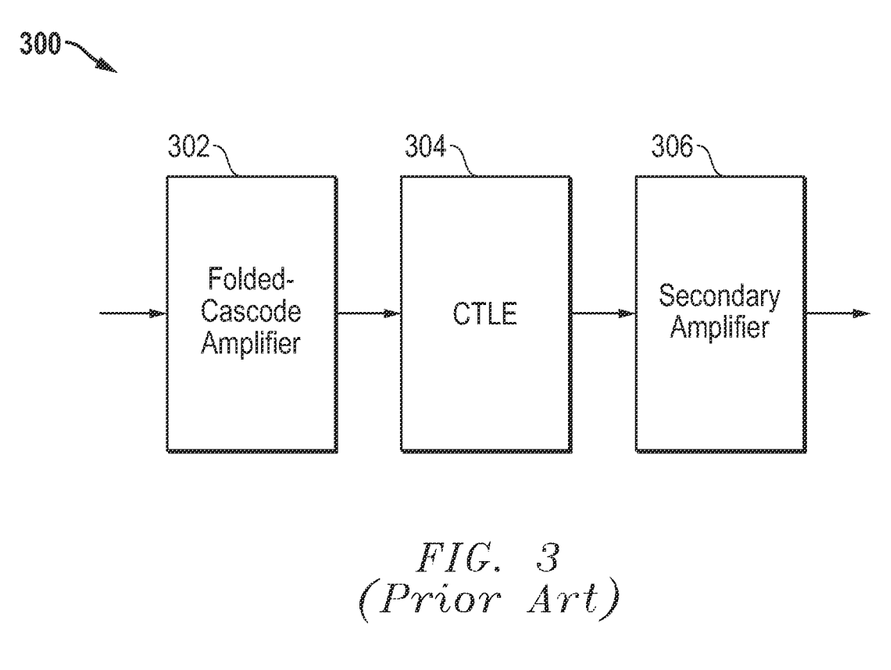
FIG. 3 illustrates in block diagram form an analog front end according to the prior art.

FIG. 3 illustrates in block diagram form an AFE 300 according to the prior art. AFE 300 according to this prior art design includes a folded-cascode amplifier 302 followed by a CTLE 304 and a secondary amplifier 306. Folded-cascode amplifier 302 is of a type commonly employed with receiver designs, but it causes bandwidth and power consumption issues that become worse as the data rates become higher. In particular, folded-cascode amplifier 302 introduces an extra pole thereby limiting the bandwidth of CTLE 304 if it directly drives the DFE. Therefore, a secondary amplifier such as secondary amplifier 304 is required, consuming extra power and space.

Figure 4:
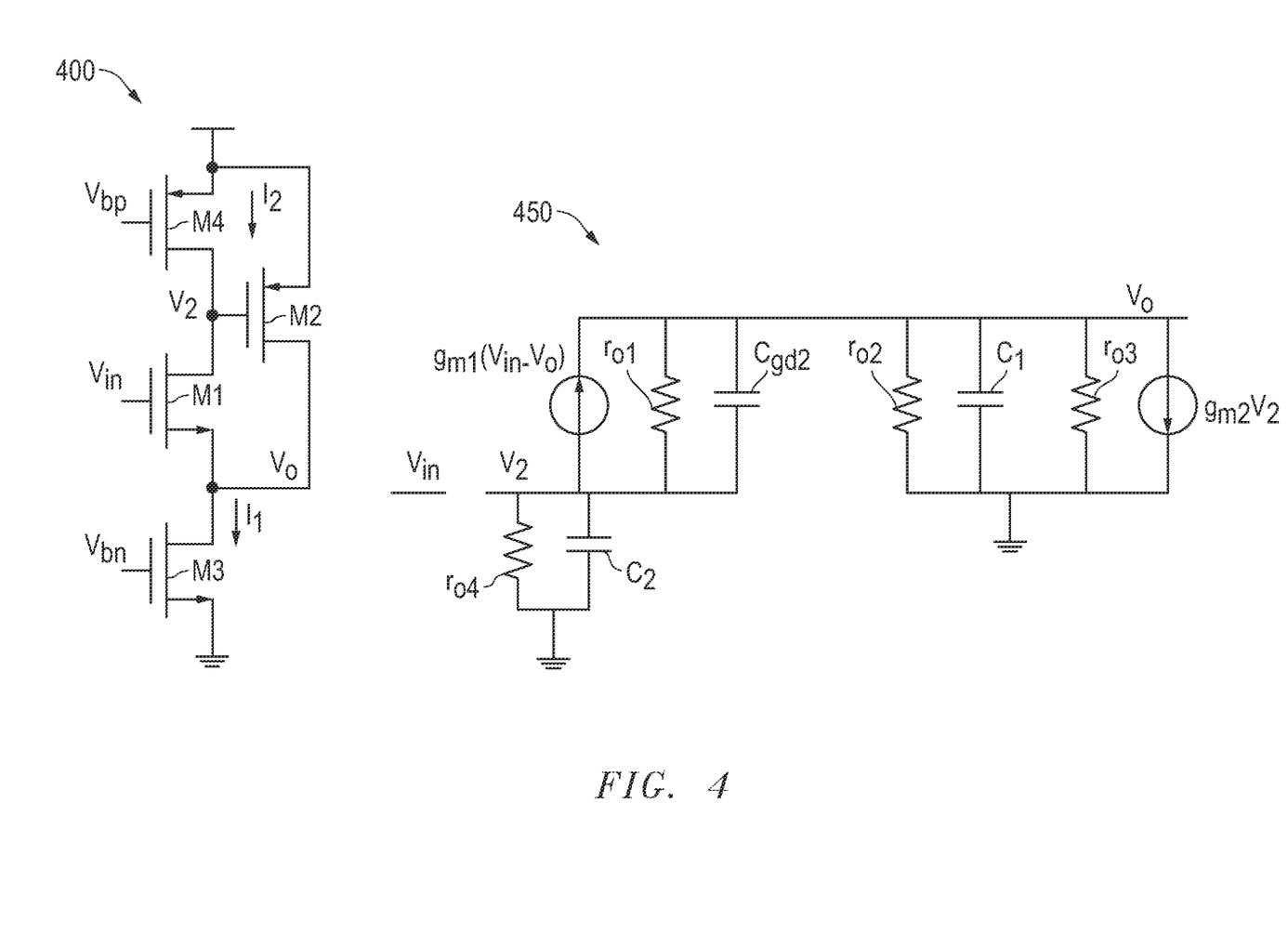
FIG. 4 illustrates in circuit diagram form a super source follower (SSF) amplifier for use in an analog front end, and a small signal equivalent circuit for the super source follower amplifier.

FIG. 4 illustrates in circuit diagram form a super source follower amplifier 400 ("SSF 400") for use in an AFE, and a small signal equivalent circuit 450 for SSF 400. Referring to SSF 400, an input terminal receiving an input voltage $V_{in}$ is connected to the gate of first N-type metal oxide semiconductor (NMOS) field-effect transistor (FET) M1, with the source terminal of M1 connected to output terminal carrying an output voltage $V_o$. A second FET M2, a P-type metal oxide semiconductor (PMOS) transistor, has a gate connected to the drain of first FET M1, a source connected to a positive voltage rail, and a drain connected to output terminal carrying $V_o$. A first current source having a current $I_1$ is connected between the source of the first FET M1 and a negative voltage rail. In this embodiment, the first current source is constructed with an NMOS FET M3 biased with a gate voltage $V_{bn}$. A second current source having a current $I_2$ is connected between the drain of the first FET M1 and the positive voltage rail. In this embodiment, the second current source is constructed with a PMOS FET M4 biased with a gate voltage $V_{bp}$.

Super source followers having the depicted topology have been used in low-frequency applications as buffers with very low output impedance, but are not known to be used in high-frequency applications such as DRAM communication link as described herein. The low output impedance is generally provided by the negative feedback formed by $M_2$, which reduces the resistance seen at node $V_o$ by a factor of $g_{m2}r_{o2}$. In order to design an SSF amplifier to meet the high bandwidth and low power consumption needs of a high-frequency receiver, a small-signal model based on small-signal equivalent circuit 450 of SSF 400 is constructed and employed to analyze the AC response. This model is constructed such that it can capture dominant high-frequency poles and zeros of SSF while providing a tool and framework for designing the device parameters to achieve a desired AC response at frequencies of interest when dealing with high data rate (greater than 14 Gbps) transmission of digital signals over a transmission line.

A high-frequency voltage transfer function of SSF 400 is derived from small signal equivalent circuit 450. In small signal equivalent circuit 450, the gain of FETs M1 and M2 are modeled with current gain equivalents $g_{m1}$ and $g_{m2}$, respectively. High frequency equivalent capacitances are included as $C_1$, $C_2$, and $C_{gd2}$, and the output resistances of FETs M1, M2, M3, and M4 are included as $r_{o1}$, $r_{o2}$, $r_{o3}$, and $r_{o4}$. A Kirchhoff's current law analysis at nodes $V_2$ and $V_o$ gives $$g_{m1}v_{in} = \left(g_{m1} + \frac{1}{Z_1}\right)v_o - \left(\frac{1}{Z_1} + \frac{1}{Z_2}\right)v_2 \tag{1}$$

and $$\frac{v_o}{Z_3} + g_{m2}v_2 + \frac{v_2}{Z_2} = 0 \tag{2}$$

where $g_m$ is the transconductance of transistor M, and $Z_m$ is the AC impedance of transistor M. Here $Z_1 = r_{o1} \| 1/sC_{gd2}$, $Z_2 = r_{o4} \| 1/sC_2$, $Z_3 = r_{o2} \| r_{o3} \| 1/sC_1$, and $s = j\omega$, where $C_1$ includes any capacitive loading from the following stage as well as Miller effect of $C_{gs1}$. Replacing $V_2$ in Eq. (1) from Eq. (2) gives $$g_{m1}v_{in} = v_o\left[\left(g_{m1} + \frac{1}{Z_1}\right) + \left(\frac{1}{Z_1} + \frac{1}{Z_2}\right) \times \frac{1}{Z_3\left(g_{m2} + \frac{1}{Z_2}\right)}\right] \quad (3)$$

Using Eq. (3), the voltage transfer function of SSF is derived at low and high frequencies. At low frequencies, ignoring the effect of capacitors, the voltage gain $A_v$ can be written as $$A_v = \frac{g_{m1}r_{o1}}{g_{m1}r_{o1} + 1/g_{m2}r_{o2} + 1} \quad (4)$$

Eq. (4) shows that DC gain of SSF 400 is slightly lower than a typical source follower amplifier due to the term $1/g_{m2}r_{o2}$ in the denominator.

Assuming the output resistance of the current sources in small signal equivalent circuit 450, $r_{o3}$ and $r_{o4}$, are much higher than $r_{o1}$ and $r_{o2}$, and the high-frequency transfer function of SSF 400 is written as $$A_v(s) = \frac{\omega_1 \omega_2 \left(1 + \frac{s}{\omega_2}\right)}{s^2 + \omega_1 s + \omega_1 \omega_7} \quad (5)$$

where $\omega_1 = g_{m1}/C_1$, $\omega_2 = g_{m2}/C_{2tot}$, and $C_{2tot}$ is the total capacitive loading of node $V_2$.

Assuming $\omega_1 = k\omega_2$ yields $$A_v(s) = \frac{k\omega_2^2 \left(1 + \frac{s}{\omega_2}\right)}{s^2 + k\omega_2 s + k\omega_2^2} \quad (6)$$

The general form of a second order system is described as $$H(s) = \frac{\omega_n^2 \left(1 + \frac{s}{\omega_2}\right)}{s^2 + 2\zeta\omega_n s + \omega_n^2} \quad (7)$$

where $\zeta$ and $\omega_n$ are damping factor and natural frequency of the system, respectively.

Comparing Eq. (6) and Eq. (7), the natural frequency for SSF 400 is derived as $$\omega_n = \sqrt{k}\omega_2, \quad \zeta = \sqrt{k}/2 \quad (8)$$

In addition, Eq. (6) shows that the voltage transfer function of SSF 400 has a left-half plane (LHP) zero at $\omega_2$ and two LHP poles at $$p_{1,2} = -\omega_1\left(\frac{1}{2} \pm \sqrt{\frac{1}{4} - \frac{1}{k}}\right) \quad (9)$$

The transistor characteristics which affect the LHP zero are important in designing a high-frequency SSF amplifier for use in an AFE like those herein, since the LHP zero provides high-frequency peaking in the AC response of SSF 400, which helps extend the bandwidth of the AFE. As can be understood from the development of Eqs. (5)-(8), the ratio k for the transconductance of transistors M1 and M2 of the SSF topology (FIG. 4) during operation is an important characteristic to achieve a desired bandwidth of SSF 400. In the exemplary embodiment, the transconductance of M1 is approximately four times that of M2. By approximately, it is meant that process variations and design variations are confined to within a 10% variance from the desired ratio. To achieve this ratio, the gate areas of devices M1 and M2 may be set as further described below, or other parameters of the transistor devices may be adjusted.

Figure 5:
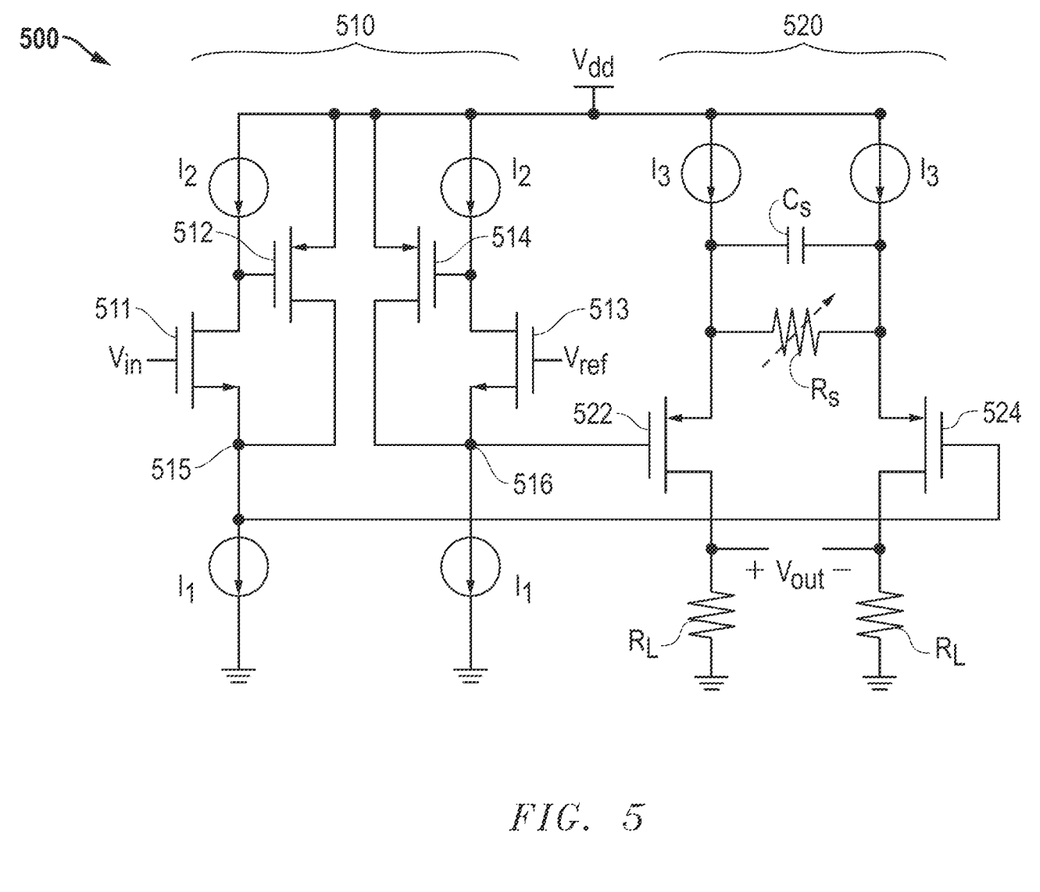
FIG. 5 illustrates in circuit diagram form an analog front end using an SSF amplifier for use in a receiver according to some embodiments.

FIG. 5 illustrates in circuit diagram form an AFE 500 for use in a receiver according to some embodiments. Generally, AFE 500 is suitable for use in a receiver such as receiver 220 (FIG. 2) and includes an SSF amplifier 510 with an output fed to a continuous-time linear equalizer 520 ("CTLE 520"). SSF amplifier 510 is constructed of two opposing branches each having a topology like that of SSF 400 (FIG. 4).

SSF amplifier 510 is a pseudo-differential amplifier with a first input terminal receiving the incoming single-ended data signal $V_{in}$, and a second input terminal receiving a reference voltage $V_{ref}$. Data signal $V_{in}$ is referenced to the I/O voltage used on the transmission link, while AFE 500 is supplied with an on chip domain voltage Vdd. A first FET 511 has a gate connected to a first input terminal, a drain, and a source connected to a first output terminal 515. A second FET 512 has a gate connected to the drain of first FET 511, and a drain connected to first output terminal 515. The opposite branch is constructed symmetrically, with a third FET 513 having a gate connected to the second input terminal, a drain, and a source connected to a second output terminal 516. A fourth FET 514 has a gate connected to the drain of third FET 513 and a drain connected to second output terminal 516. A first current source establishing a current $I_1$ is connected between the source of first FET 511 and a negative voltage rail. A second current source is connected between the source of third FET 513 and the negative voltage rail, and is biased to establish an identical current $I_1$. A third current source establishing a current $I_2$ is connected between the drain of first FET 511 and the positive voltage rail, and a fourth current source establishing an identical current $I_2$ is connected between the drain of third FET 513 and the positive voltage rail.

In operation, $V_{ref}$ is trained for maximum eye opening after the DFE. Because the input stage of SSF 510 is NMOS, its outputs are shifted down to voltage levels suitable for the following single-stage PMOS-input CTLE 520. Very low output impedance of the SSF stage along with gain peaking at high frequencies enables target BW requirements, with operation up to 20 Gbps and beyond without the need for more amplification stages or other forms of peaking such as inductive peaking.

When the depicted AFE 500 is employed in a DRAM-GPU interface, besides the stringent low-power requirements, AFE 500 must convert a single-ended incoming data stream from the I/O supply domain to the core supply domain while performing linear equalization. In this embodiment, CTLE 520 is a single-stage RC-degenerated PMOS-input CTLE. CTLE 520 includes first and second input terminals at the gates of PMOS FETs 522 and 524, respectively. Two current sources are connected between the positive voltage rail and the sources of FETs 522 and 524, and are biased to establish a current $I_3$ each branch of CTLE 520. A degeneration capacitor $C_s$ and a resistor $R_s$ are connected across the two branches. $R_s$ is a programmable degeneration resistor. Each branch is connected to the negative voltage rail through a respective load resistor $R_L$, with the voltage at the positive terminals of each $R_L$ providing the output voltage of CTLE 520.

To provide a desired AC transfer function and output impedance to drive CTLE 520, transistors 511 and 512 have relative sizes and transconductance values designed to provide a frequency response of the SSF amplifier with a peak at a frequency approximately ⅔ of the expected data rate. Transistors 513 and 514 have similar relationship in size and transconductance. Preferred embodiments are used with DDR6 or GDDR6 DRAM having a data rate of at least 14 Gbps. Some embodiments can provide even higher data rates, such as 16 Gpbs, 20 Gbps, and 24 Gbps. In the exemplary embodiment, the operating transconductance of transistor 511, as discussed above with respect to FIG. 4, is approximately four times that of transistor 512. In some embodiments, the transistors 512 and 514 have a gate size of at most 70% of a gate size of the transistors 511 and 513, respectively. To achieve higher frequency peaking, other ratios are used, for most 60%, at most 50%, or at most 40%.

AFE 500 is employed in a receiver such as receiver 220 (FIG. 2) and drives a non-linear equalizer such as DFE 230 coupled to receive an output signal of AFE 500 and compensate for inter-symbol interference at a data rate of at least 14 Gbps. AFE 500 using SSF amplifier 510 and CTLE 520 has the advantage that it is able to directly drive a non-linear equalizer without the need for a second stage amplifier.

Figure 6:
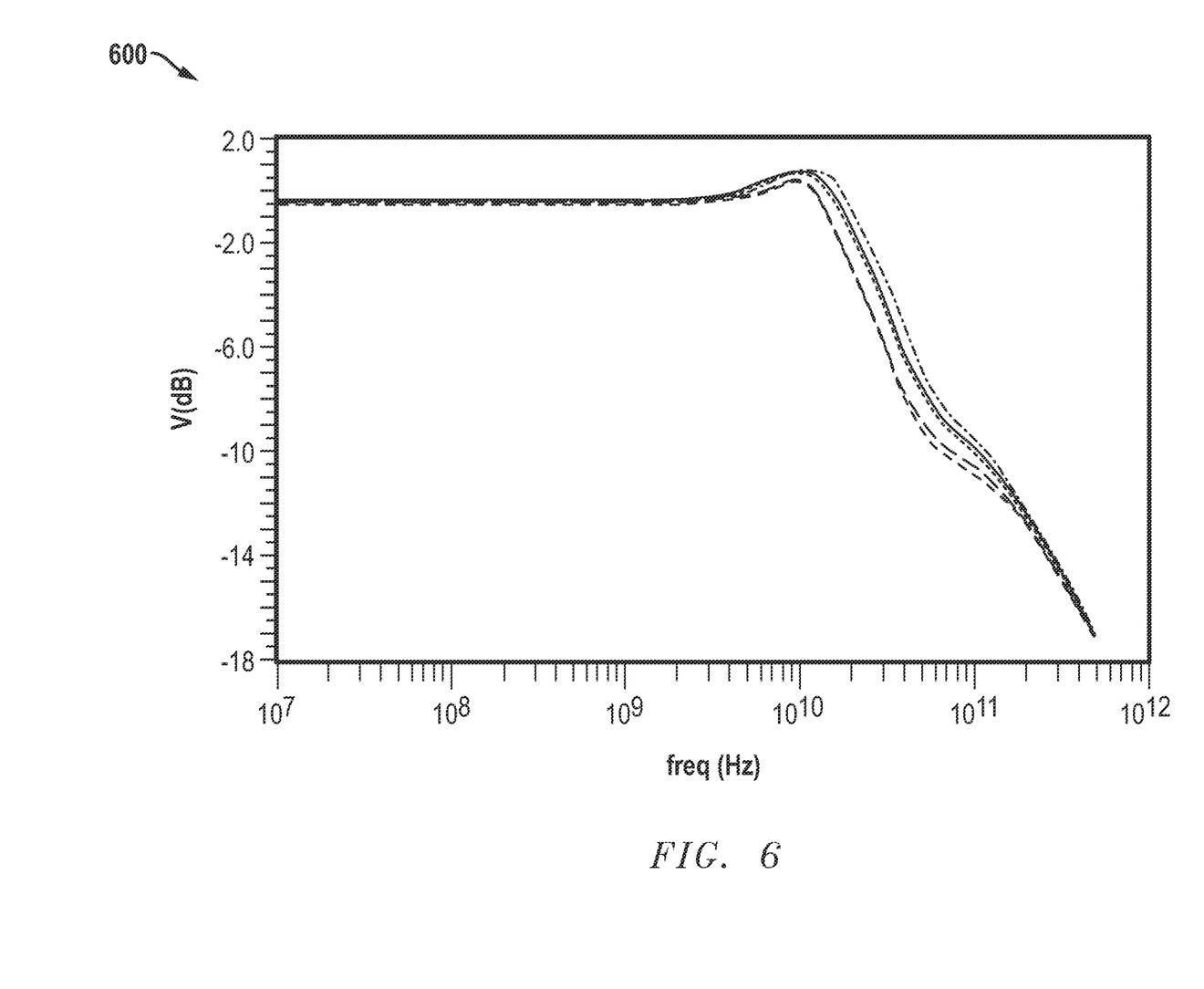
FIG. 6 is a graph showing the frequency response of analog front end of FIG. 5.

FIG. 6 is a graph 600 showing the frequency response of AFE 500 of FIG. 5. The vertical axis shows the voltage gain in dB, and the horizontal axis shows frequency. Several waveforms on the graph show simulations over several process and temperature conditions. As depicted AFE 500 has a low DC gain at lower frequencies followed by peaking at high frequencies to produce a flat AC response when combined with the distortion introduced by the channel. Table 1 below shows performance characteristics of an example implementation of AFE 500 simulated in FIG. 6. The layout of the design is implemented with a 7 nm fin field-effect transistor (FinFET) technology. The performance is demonstrated using a worst-case RC-extracted netlist with a typical supply voltage of 1.35V+/−10%. A typical operating temperature of 85 C is used, along with two temperature corners of 0 C and 125 C.

TABLE 1

| AC performance summary of SSF and AFE | | | |
|---|---|---|---|
|  | Min | Typ | Max |
| Supply Voltage (V) | 1.215 | 1.35 | 1.485 |
| Temperature (C) | 0 | 85 | 125 |
| AFE BW (GHz) | 13.48 | 16.11 | 20.12 |
| SSF BW (GHz) | 18.48 | 21.6 | 27 |
| AFE gain @ 10 GHz (dB) | 1.78 | 4 | 5.83 |
| AFE peak gain (dB) | 1.78 | 4 | 5.92 |
| AFE boost (dB) | 2.34 | 4.2 | 5.39 |
| IDC (mA) | 3.23 | 3.87 | 4.72 |

Various parts of data processing system 100 may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:

1. A receiver circuit comprising:
an analog front end including a super source follower (SSF) amplifier having a first input terminal adapted to couple to a transmission line to receive an input signal referenced to a first voltage level, a second input terminal adapted to receive a reference voltage, and first and second output terminals adapted to provide an amplified signal referenced to a second voltage level; and
a non-linear equalizer coupled to receive an output signal of the analog front end and compensate for inter-symbol interference at a data rate of at least 14 Gbps,
wherein the SSF amplifier includes transistors having relative sizes selected to provide a frequency response of the SSF amplifier with a peak at a frequency approximately ⅔ of the data rate.

2. The receiver circuit of claim 1, wherein the transistors of the SSF amplifier include:
a first field effect transistor (FET) having a gate coupled to the first input terminal, a drain, and a source connected to the first output terminal;
a second FET having a gate connected to the drain of the first FET and a drain connected to the first output terminal;
a third FET having a gate connected to the second input terminal, a drain, and a source connected to the second output terminal; and
a fourth FET having a gate connected to the drain of the third FET and a drain connected to the second output terminal,
wherein the first and third FETs have a transconductance approximately four times that of the second and fourth FETs, respectively.

3. The receiver circuit of claim 2, wherein the SSF amplifier further includes:
a first current source coupled between the source of the first FET and a negative voltage rail, and a second current source coupled between the source of the third FET and the negative voltage rail; and
a third current source coupled between the drain of the first FET and a positive voltage rail, and a fourth current source coupled between the drain of the third FET and the positive voltage rail.

4. The receiver circuit of claim 2, wherein the second and fourth FETs have a gate size of at most 70% of a gate size of the first and third FETs, respectively.

5. The receiver circuit of claim 1, wherein the analog front end directly drives the non-linear equalizer without the use of any second stage amplifier.

6. The receiver circuit of claim 1, the analog front end further including a continuous-time linear equalizer (CTLE)

circuit coupled between the output terminals of the SSF amplifier and the non-linear equalizer.

7. The receiver circuit of claim 1, wherein the non-linear equalizer is a speculative decision-feedback equalizer (DFE).

8. A data processing system comprising:
a DRAM memory; and
a data processor coupled to the DRAM memory with one or more transmission lines and including respective receivers coupled to the transmission lines to receive data signals therefrom, each receiver comprising:
an analog front end including a super source follower (SSF) amplifier having a first input terminal coupled to a respective one of the transmission lines to receive an input signal referenced to a first voltage level, a second input terminal adapted to receive a reference voltage, and first and second output terminals adapted to provide an amplified signal referenced to a second voltage level; and
a non-linear equalizer coupled to receive an output signal of the analog front end and compensate for inter-symbol interference at a data rate of at least 14 Gbps,
wherein the SSF amplifier includes transistors having relative sizes selected to provide a frequency response of the SSF amplifier with a peak at a frequency approximately ⅔ of the data rate.

9. The system of claim 8, wherein the transistors of the SSF amplifier include:
a first field effect transistor (FET) having a gate coupled to the first input terminal, a drain, and a source connected to the first output terminal;
a second FET having a gate connected to the drain of the first FET and a drain connected to the first output terminal;
a third FET having a gate connected to the second input terminal, a drain, and a source connected to the second output terminal; and
a fourth FET having a gate connected to the drain of the third FET and a drain connected to the second output terminal,
wherein the first and third FETs have a transconductance approximately four times that of the second and fourth FETs, respectively.

10. The system of claim 9, wherein the SSF amplifier further includes:
a first current source coupled between the source of the first FET and a negative voltage rail, and a second current source coupled between the source of the third FET and the negative voltage rail; and
a third current source coupled between the drain of the first FET and a positive voltage rail, and a fourth current source coupled between the drain of the third FET and the positive voltage rail.

11. The system of claim 9, wherein the second and fourth FETs have a gate size of at most 70% of a gate size of the first and third FETs, respectively.

12. The system of claim 8, wherein the analog front end directly drives the non-linear equalizer without the use of any second stage amplifier.

13. The system of claim 8, the analog front end further including a continuous-time linear equalizer (CTLE) circuit coupled to the output terminal of the SSF amplifier.

14. The system of claim 13, wherein the non-linear equalizer is a speculative decision-feedback equalizer (DFE) coupled to the output of the CTLE circuit.

15. A method comprising:
(a) at a first circuit, receiving a signal over a transmission line from a second circuit, the signal referenced to a first voltage level and having a data rate of at least 14 Gbps;
(b) inputting the signal to an analog front end including a super source follower (SSF) amplifier having a frequency response with a peak at a frequency approximately ⅔ of the data rate;
(c) outputting an amplified version of the signal from the analog front end referenced to a second voltage level different from the first voltage level; and
(d) inputting the amplified version of the signal to a non-linear equalizer compensate for inter-symbol interference.

16. The method of claim 15, further comprising, before outputting the amplified version of the signal from the analog front end, feeding the amplified version of the signal to a continuous-time linear equalizer (CTLE) circuit.

17. The method of claim 15, wherein the non-linear equalizer is a speculative decision-feedback equalizer (DFE).

18. The method of claim 15, wherein the analog front end directly drives the non-linear equalizer without the use of any second stage amplifier.

19. The method of claim 15, wherein the first circuit is a receiver on a data processor and the second circuit is a DRAM memory.

20. The method of claim 15, wherein the first circuit is a DRAM memory and the second circuit is a receiver on a data processor.

* * * * *